United States Patent
Nelson et al.

(10) Patent No.: US 6,794,887 B1
(45) Date of Patent: Sep. 21, 2004

(54) TEST HEAD INCLUDING DISPLACEABLE SWITCH ELEMENT

(75) Inventors: Edward W. Nelson, Tigard, OR (US); Travis S. Ellis, Scappoose, OR (US); Paul D. Wohlfarth, Vernonia, OR (US)

(73) Assignee: Credence Systems Corporation, Milpitas, CA (US)

( * ) Notice: Subject to any disclaimer, the term of this patent is extended or adjusted under 35 U.S.C. 154(b) by 32 days.

(21) Appl. No.: 09/991,019

(22) Filed: Nov. 15, 2001

(51) Int. Cl.[7] ............................................. G01R 31/02
(52) U.S. Cl. ................... 324/754; 324/761; 324/158.1
(58) Field of Search ................................ 324/754, 755, 324/761, 762, 158.1, 73.1; 439/482

(56) References Cited

U.S. PATENT DOCUMENTS 4,465,972 A * 8/1984 Sokolich ..................... 324/761
5,491,427 A * 2/1996 Ueno et al. ................. 324/754

* cited by examiner

Primary Examiner—Vinh P. Nguyen
(74) Attorney, Agent, or Firm—John Smith-Hill; Smith-Hill and Bedell

(57) ABSTRACT

A pin card for mounting in a test head of a semiconducter integrated circuit tester to implement test channels of the tester includes contact pins connected to terminals of respective test channels. Each contact pin has a free end for engaging a load board. A conductive switch element is displaceable between a first position, in which the switch element is electrically isolated from one or more of the contact pins, and a second position, in which the switch element is in electrically conductive contact with one or more of the contact pins.

9 Claims, 4 Drawing Sheets

```
G   S   G   S   G   S   G   S   G   A   A   A   A
O   O   O   O   O   O   O   O   O   O   O   O   O

O   O   O   O   O   O   O   O   O   O   O   O   O
  G   S   G   S   G   S   G   S   A   A   A   A
```

```
G   S   S   S   S   S   S   S   S   A   A   A   A
O   O   O   O   O   O   O   O   O   O   O   O   O

O   O   O   O   O   O   O   O   O

O   O   O   O   O   O   O   O   O   O   O   O
  S   S   S   S   S   S   S   S   A   A   A   A
```

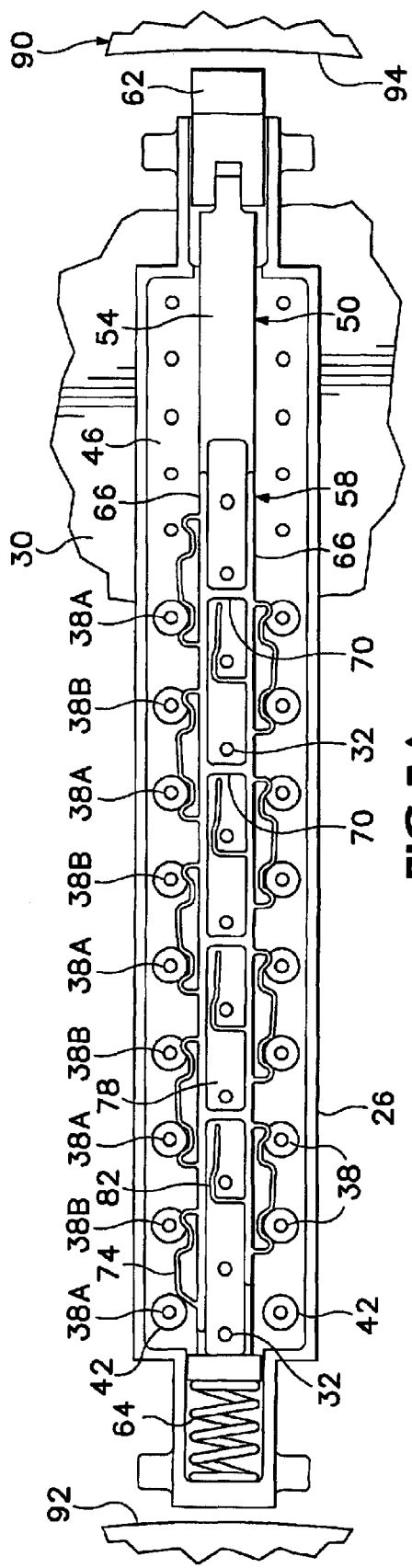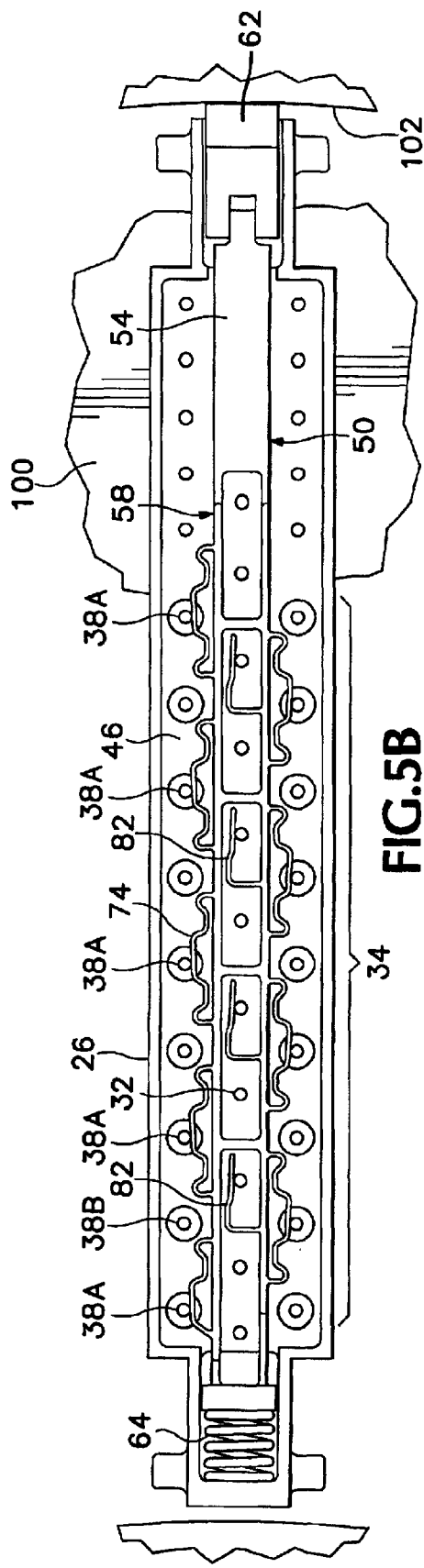

TEST HEAD INCLUDING DISPLACEABLE SWITCH ELEMENT

BACKGROUND OF THE INVENTION

This invention relates a test head including a displaceable switch element.

A semiconductor integrated circuit die has an array of contact pads distributed in a predetermined pattern over a major surface of the die.

A conventional general-purpose semiconductor integrated circuit tester includes a test head and a wafer prober or device handler for positioning a device under test (DUT) at a test location for testing. For convenience, in the following description it will be assumed that the test head is in the so-called DUT down orientation in which the test head is oriented to engage a DUT whose major surface is presented upwards. The test head includes a support frame, a docking plate attached to the support frame at the bottom of the test head, and pin cards mounted in the support frame and each having multiple contact pins projecting downwards beyond the docking plate. The contact pins are distributed over a much greater area than the area of the major surface of the DUT. A load board is attached to the docking plate and has on one side (the test-head side) an array of pads that are engaged by the contact pins of the test head and on its opposite side (the DUT side) an array of pins for engaging the contact pads of the DUT. The load board includes conductors that connect the contact pads at the test-head side of the load board to the corresponding pins at the DUT side of the load board. The load board thus serves as an interface between the test head and the DUT.

The load board must be manufactured with a high degree of precision to ensure that all the contact pads will be and remain in the correct positions, within the applicable tolerances, over the intended useful life of the load board.

In addition to the conductors that connect the contact pads at the test-head side of the load board to the corresponding pins at the DUT side of the load board, the load board also includes any special circuits that are not contained in the general purpose tester but may be required in order to allow the general purpose tester to analyze a particular DUT. These circuits are often complex and they may be custom manufactured for use in the load board.

Each load board is designed for use with a DUT having a particular pattern of contact pads. A different load board may be required for each pattern of contact pads; and different load boards may even be required for different devices having the same pattern of contact pads. Accordingly, the operator of a testing facility may require a large number of load boards.

The stringent requirements regarding the physical structure of the load board, and the design, manufacture and support of the special circuits, result in the load board being very expensive to manufacture. Accordingly, it is desirable that the operator of a testing facility be able to use the load board designed for a particular device so long as there is demand for that device.

The contact pins of the test head are conventionally implemented using so-called pogo pins. A pogo pin includes a socket that is firmly secured in a support member, a barrel that is press fit into the socket, a plunger that is a sliding fit inside the barrel, and a spring inside the barrel urging the plunger toward a projecting position. The load board is positioned so that the tips of the plungers are in contact with the pads on the load board and the load board is then displaced towards the test head and secured to the docking plate, establishing electrically conductive pressure contact between the tip of each plunger and the respective contact pad.

Referring to FIG. 1A, the pin card that is used in one known form of tester has pogo pins positioned to engage contact pads arranged in two rows of nine pads. In each row, signal I/O pads, which are engaged by signal I/O pins of the pin card, alternate with ground pads, which are engaged by ground pins of the pin card. In this known form of tester, each pin card is able to support eight tester channels. The pin card may also include auxiliary pogo pins that engage auxiliary contact pads.

It has been proposed that in a new design of tester the pin card should have an inner row of eleven ground pins that are positioned to engage an inner row of eleven ground pads, and two outer rows of signal I/O pins that are positioned to engage respective outer rows of eight signal I/O pads, as shown in FIG. 1B. The pin card may also include auxiliary pogo pins that engage auxiliary contact pads. A pin card in accordance with this proposal would be able to support sixteen tester channels.

The new design of tester has certain advantages with respect to the known form of tester, but it will be appreciated that the pin cards for the new design are not compatible with a legacy load board, i.e. a load board designed for use with the earlier tester, because the pin card does not ground alternate pins in the two outer rows of contact pads.

If a tester of the new design could be rendered compatible with a legacy load board, a testing facility equipped with a tester of the known form could upgrade to a tester of the new design without replacing its legacy load boards. Further, the facility could upgrade its capacity by sharing load boards between the tester of the known form and the tester of the new design.

SUMMARY OF THE INVENTION

In accordance with a first aspect of the invention there is provided a test head for a semiconductor integrated circuit tester, comprising a plurality of contact pins connected to tester channels of the tester, each contact pin having a free end for engaging a load board, and a conductive switch element displaceable between a first position, in which the switch element is electrically isolated from one or more contact pins, and a second position, in which the switch element is in electrically conductive contact with one or more contact pins.

In accordance with a second aspect of the invention there is provided a test head for a semiconductor integrated circuit tester, comprising a support frame, and a plurality of pin cards mounted in the support frame, each pin card including a plurality of contact pins connected to tester channels of the tester, each contact pin having a free end for engaging a load board, and a conductive switch element displaceable between a first position, in which the switch element is electrically isolated from one or more contact pins, and a second position, in which the switch element is in electrically conductive contact with one or more contact pins.

In accordance with a third aspect of the invention there is provided a pin card for mounting in a test head of a semiconductor integrated circuit tester to implement test channels of the tester, the pin card including a plurality of contact pins connected to terminals of respective test channels, each contact pin having a free end for engaging a load board, and a conductive switch element displaceable between a first position, in which the switch element is electrically isolated from one or more contact pins, and a second position, in which the switch element is in electrically conductive contact with one or more contact pins.

In accordance with a fourth aspect of the invention there is provided an assembly for attachment to a pin card of a semiconductor integrated circuit tester, comprising a pogo block, at least two pogo pins mounted in the pogo block, a conductive switch element mounted in the pogo block and displaceable between a first position, in which the switch element is electrically isolated from one or more pogo pins, and a second position, in which the switch element is in electrically conductive contact with one or more pogo pins.

BRIEF DESCRIPTION OF THE DRAWINGS

For a better understanding of the invention, and to show how the same may be carried into effect, reference will now be made, by way of example, to the accompanying drawings, in which FIG. 5A is a partial plan view of the lower pogo block with the switch element in a first position, and FIG. 5B is a similar view of the lower pogo block with the switch element in a second position.

DETAILED DESCRIPTION

Figures 1A, 1B, 2:
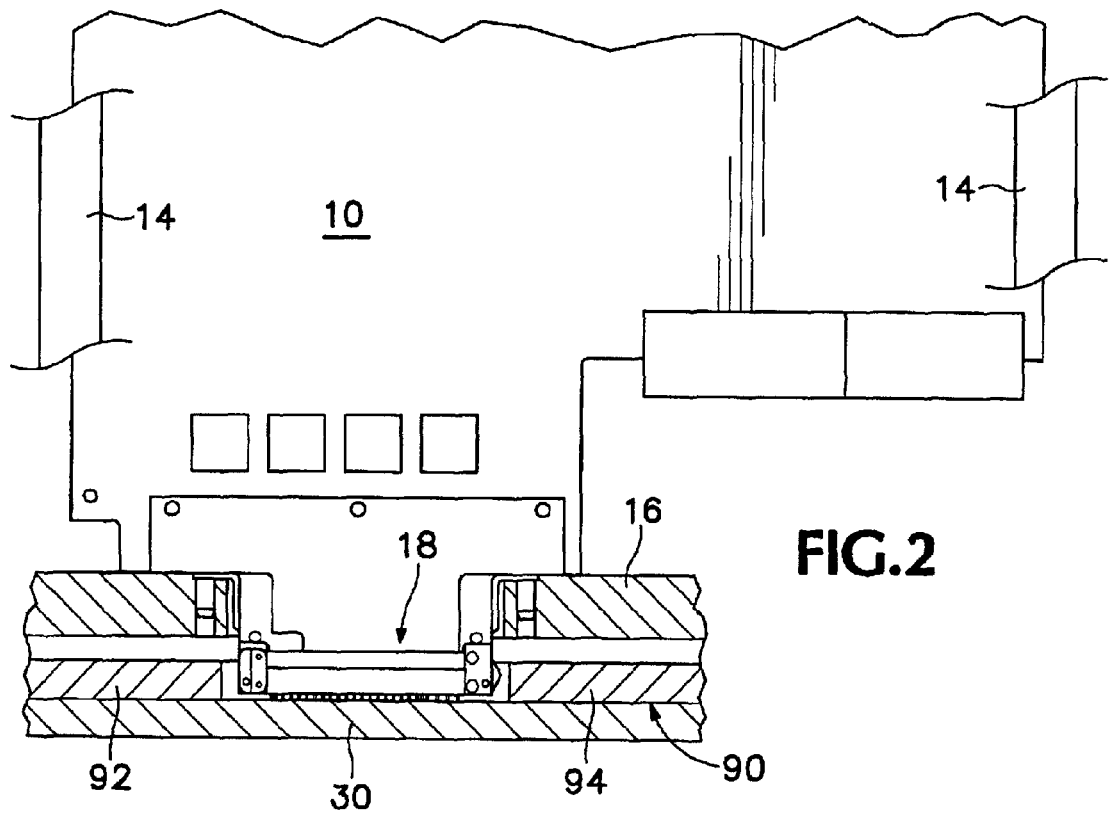
FIG. 1A illustrates the location of pogo pins for a pin card in a tester in accordance with the prior art.
FIG. 1B illustrates the locations of pogo pins for a pin card of a tester in accordance with the new design.
FIG. 2 is a partial side view of a pin card in accordance with the present invention.

FIG. 2 illustrates a pin card 10 that is mounted in the support frame of a test head and supports the circuitry for sixteen tester channels. The support frame includes guides 14 and hold-downs (not shown) for positioning the pin cards relative to a docking plate 16. The test head may include 64 pin cards mounted in the support frame so that they extend radially from a common central axis. The pin card has at least one signal layer containing signal traces and at least one ground layer connected to an electrical ground of the tester.

Figure 3:
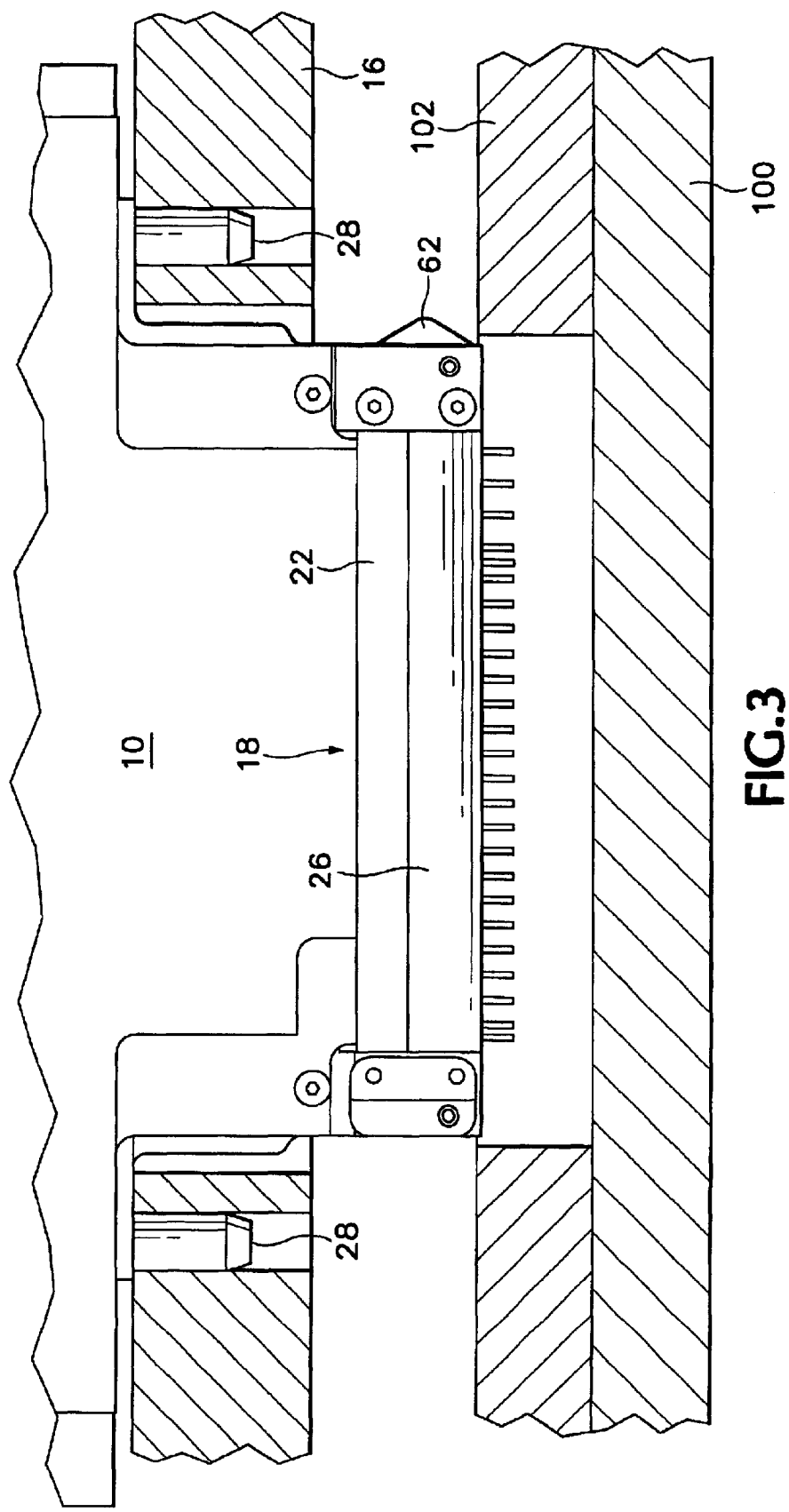
FIG. 3 is an enlarged partial side view of the pin card and illustrates a pogo switch assembly that includes an upper pogo block and a lower pogo block.
Figure 4:
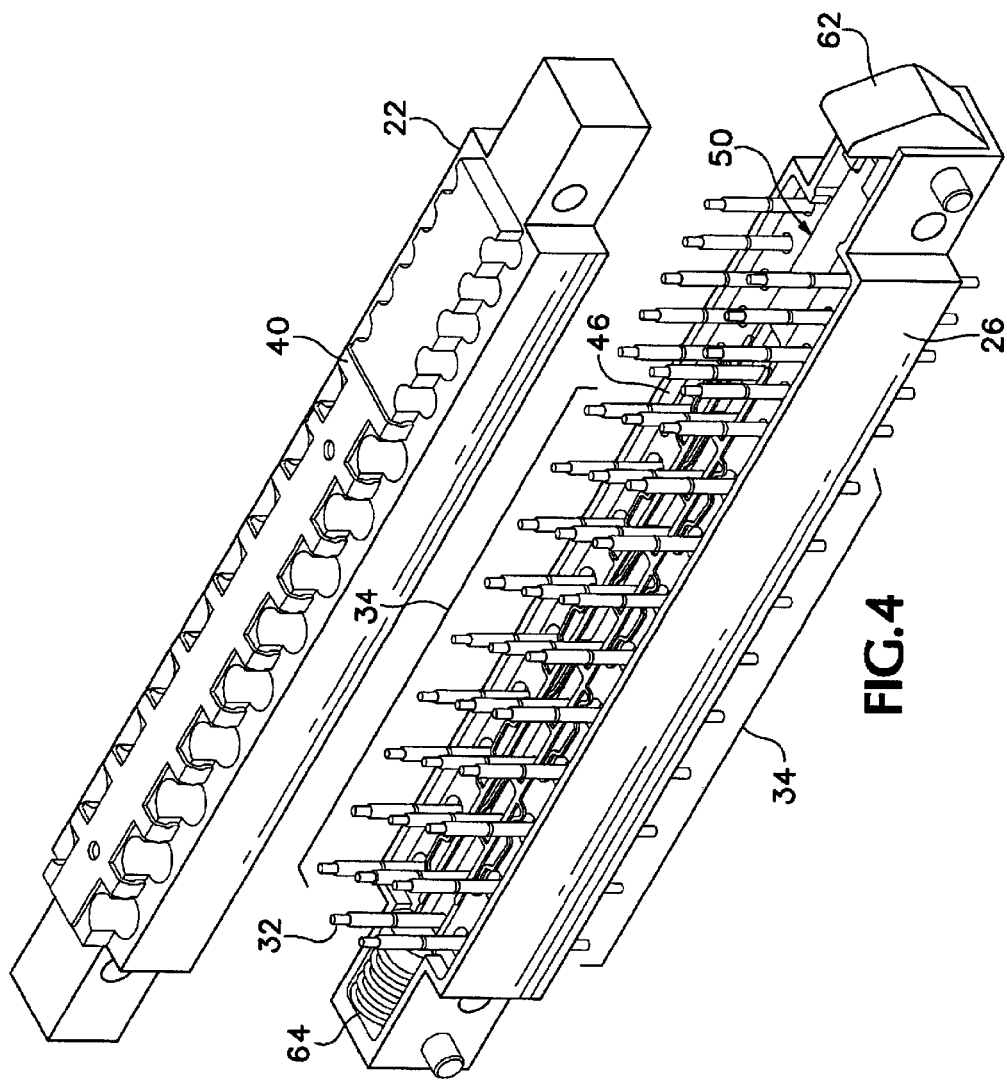
FIG. 4 is a partially exploded view of the pogo switch assembly and illustrates a switch element in the lower pogo block.

A pogo switch assembly 18 is attached to the pin card 10 at a lower edge thereof. Referring to FIGS. 3 and 4, the pogo switch assembly includes an upper pogo block 22 and a lower pogo block 26. An array of pogo pins projects downwards from the pogo switch assembly 18. Alignment pins 28 project from the pin card 10 and engage guide bores in the docking plate 16 and thereby position the pogo pins relative to the docking plate.

A load board 30 (FIG. 5A) attached to the docking plate 16 provides an electrical interface between the pin cards and the DUT. The load board 30 is a standard load board, designed for use with a test head including pin cards of the form shown in FIGS. 2 and 3. Accordingly, at the test-head side, the load board 30 has contact pads distributed in a pattern such that each pogo pin engages one of the contact pads. The pogo pins are in electrically conductive pressure contact with the contact pads respectively.

Referring to FIG. 4, the pogo pins that are of particular interest in the context of the invention are in three rows, namely an inner row of eleven pins 32 and two outer rows 34 of nine pins each. Referring again to FIG. 5A, the pogo pins 38 in each outer row 34 are in two groups, 38A and 38B. The pins 38A and 38B alternate in each row. The distinction between the two groups of pins will be described below. The pogo switch assembly 18 accommodates additional pogo pins, but they are not relevant to this invention.

The upper pogo block 22 (FIGS. 3 and 4) is made of metal and is electrically connected to the ground layer of the pin card by a grounding clip 40 that grips the upper pogo block. The sockets of the pogo pins 32 in the inner row are fitted directly into respective bores in the upper Pogo block and accordingly these pogo pins are grounded. The sockets of the pogo pins 38 in the two outer rows 34 are secured in respective insulating sleeves (not shown), which are in turn held in bores of the upper pogo block 22. The insulating sleeves provide electrical insulation between the upper pogo block 22 and the pogo pins 38. At their upper ends, the pogo pins 38 are electrically connected to the terminals of respective tester channels. The pogo pins extend downwards from the upper pogo block 22 and pass through a lower pogo block 26.

Referring to FIG. 4, the lower pogo block 26 is made of metal and is formed with a cavity 46 through which the pogo pins extend and which accommodates a conductive switch element 50. Below the switch element, the pogo pins pass through sleeves 42 of low-friction electrically insulating material, such as PTFE, which provide electrical insulation between the pogo pins and the lower pogo block.

Referring to FIG. 5A, the switch element 50 comprises switch support frame 54, which is made of aluminum and is displaceable within the cavity 46, and an interconnect strip 58 of a resilient conductive material, such as gold-plated beryllium copper, attached to the switch support frame 54. The frame 54 protrudes from the lower pogo block at its radially outer end and carries a follower 62. The follower 62 has an actuation face that is inclined upwards and outwards at an acute angle to vertical. The purpose of the follower will be described below. A compression spring 64 urges the switch element 50 radially outwards relative to the lower pogo block.

Still referring to FIG. 5A, the interconnect strip comprises two rails 66 in parallel spaced relationship connected by cross bars 70. Spring elements 74 project from each rail. Each spring element 74 is generally bow-shaped but has one or two zones at which it has a reverse bend towards the rail 66, providing a recess. The two rails 66 and the cross bars 70 define windows 78 and the rail 66 is provided with additional generally L-shaped spring elements 82 that project from one of the rails 66 into the windows respectively. The pogo pins 32 pass through the windows 78.

The switch element 50 is movable relative to the lower pogo block between the position shown in FIG. 5A and the position shown in FIG. 5B. When the standard load board 30 is attached to the docking plate, the switch element is in the position shown in FIG. 5A. In this position, there is a clearance between the spring elements 74 and the signal I/O pogo pins 38. The grounded pogo pins 32 in the inner row are spaced from the spring elements 82. In this condition, all the pins 38 can be used for signal I/O. Signals are propagated between the pin card and the load board through the signal I/O pogo pins. The ground pins 32 provide a firm ground for the load board through their connection to the ground layer of the pin card.

The standard load board 30 is attached to a stiffener 90 for preventing excessive deflection of the load board due to the force exerted by the pogo pins when the load board is attached to the docking plate. The stiffener has inner and outer rings 92, 94 that are connected by spokes (not shown) so that the stiffener defines sector-shaped openings into which the pogo switch assemblies of respective groups of pin cards extend.

The internal radius of the outer ring 94 of the stiffener 90 is sufficiently large that when the standard load board is attached to the docking plate, a clearance remains between the outer ring and the follower, as shown in FIG. 5A.

When the standard load board 30 is removed and replaced with a legacy load board 100, the grounded pins 32 of the inner row no longer serve to ground the load board because the legacy load board does not have contact pads that are positioned to engage these pins.

The location of the follower in such that when the legacy load board 100 is attached to the docking plate, the outer stiffener ring 102 serves as an actuation element that engages the actuation face of follower 62 and pushes the follower 62 and the switch support frame 54 attached thereto radially inwards against the force of the compression spring 64 to the position shown in FIG. 5B.

In the position shown in FIG. 5B, the spring elements 82 engage alternate pogo pins 32 in the inner row and consequently the interconnect strip 58 is grounded. Furthermore, the pogo pins 38A engage the spring elements 74 between the respective bends. Consequently, the pogo pins 38A are grounded through the interconnect strip and the pogo pins 32. The pogo pins 38B do not engage the spring elements and are not grounded. Thus, the pins 38A and the ground layer of the load board are firmly grounded. Therefore, the pin card can be used with the legacy load board.

The tester channels that are connected to the pogo pins 38A are placed in a high impedance state.

By providing the switch element incorporated in the lower pogo block, the pogo pins 38A are grounded at a location close to the load board, thereby ensuring that the pogo pins provide a firm ground and the 50 ohm transmission line environment provided by the conductive upper pogo block extends to a location close to the tips of the pogo pins 38.

It will be appreciated that the invention is not restricted to the particular embodiment that has been described, and that variations may be made therein without departing from the scope of the invention as defined in the appended claims and equivalents thereof. For example, although engagement of the follower with the stiffener allows automatic actuation of the switch to its legacy board position when the legacy load board is secured to the docking plate, it would be possible to provide for manual or electromechanical actuation of the switch and to employ a detente mechanism to retain the switch in the legacy board position. Also, the invention is not restricted to the switch employing a member that is radially displaced and other switch mechanisms may be used instead. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A test head for a semiconductor integrated circuit tester, comprising:
   a support frame,
   a plurality of contact tins connected to tester channels of the tester, each contact pin having a free end for engaging a load board,
   a plurality of pin cards mounted in the support frame for implementing the tester channels, wherein the plurality of contact pins are attached to a pin card, and
   a conductive switch element displaceable between a first position, in which the switch element is electrically isolated from one or more contact pins, and a second position, in which the switch element is in electrically conductive contact with one or more contact pins.

2. A test head according to claim 1, wherein the pin card includes a switch block in which the contact pins are mounted and through which the contact pins extend, and wherein the switch block is formed with a cavity through which the contact pins extend and the switch element is located in said cavity.

3. A test head according to claim 2, wherein the switch block is made of electrically conductive material and the contact pins comprise a first group of contact pins mounted in the switch block in a manner such that the contact pins of the first group are in electrically conductive contact with the switch block and a second group of contact pins mounted in the switch block in a manner such that when the switch element is in the first position the contact pins of the second group are electrically isolated from the switch block, and wherein the switch element, when in the second position, is in electrically conductive contact with at least one contact pin of the first group and at least one contact pin of the second group and electrically connects said one contact pin of the first group and said one contact pin of the second group.

4. A test head according to claim 3, wherein the second group of contact pins comprises first and second subgroups and the switch element, when in the second position, is in electrically conductive contact with the pins of the first subgroup and is electrically isolated from the pins of the second group.

5. A test head according to claim 3, wherein the switch element is displaceable linearly between the first position and the second position.

6. A test head according to claim 2, wherein the switch block is made of electrically conductive material and the contact elements comprise a first row of contact elements mounted in the switch block in a manner such that the contact pins of the first row are in electrically conductive contact with the switch block and a second row of contact pine mounted in the switch block in a manner such that when the switch element is in the first position the contact pins of the second row are electrically isolated from the switch block, the contact pins of the second row being in first and second groups, and wherein the switch element, when in the second position, is in electrically conductive contact with the contact pins of the first groups.

7. A test head for a semiconductor integrated circuit tester, comprising:
   a plurality of contact pins connected to tester channels of the tester, each contact pin having a free end for engaging a load board, and
   a conductive switch element displaceable between a first position, in which the switch element is electrically isolated from one or more contact pins, and a second position, in which the switch element is in electrically conductive contact with one or more contact pins, and wherein the switch element includes a spring member that is configured so that when the switch element is in the first position, the spring member is spaced from said one contact pin and when the switch element is in its second position the spring member is in electrically conductive pressure contact with said one contact pin.

8. A semiconductor integrated circuit tester comprising:

a test head comprising a plurality of contact pins connected to tester channels of the tester, each contact pin having a free end for engaging a load board, and a conductive switch element displaceable between a first position, in which the switch element is electrically isolated from one or more contact pins, and a second position, in which the switch element is in electrically conductive contact with one or more contact pins, wherein the switch element is displaceable linearly between its first position and its second position and the test head includes a follower attached to the switch element and a bias spring urging the switch element towards its first position, a load board attached to the test head and engaged by the contact pins, and an actuation element that is attached to the load board and engages the follower and urges the switch element to its second position against resistance of the bias spring.

9. A test head for a semiconductor integrated circuit tester, comprising:

a support frame, and a plurality of pin cards mounted in the support frame, each pin card including:

a plurality of contact pins connected to tester channels of the tester, each contact pin having a free end for engaging a load board, and a conductive switch element displaceable between a first position, in which the switch element is electrically isolated from one or more contact pins, and a second position, in witch the switch element is in electrically conductive contact with one or more contact pins.

* * * * *